(12) United States Patent
Iwamura et al.

(10) Patent No.: US 10,886,573 B2
(45) Date of Patent: Jan. 5, 2021

(54) BATTERY PACK AND ELECTRIC DEVICE INCLUDING BATTERY PACK

(71) Applicant: PANASONIC INTELLECTUAL PROPERTY MANAGEMENT CO., LTD., Osaka (JP)

(72) Inventors: Norihiro Iwamura, Shiga (JP); Masaki Ikeda, Mie (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 446 days.

(21) Appl. No.: 14/537,816

(22) Filed: Nov. 10, 2014

(65) Prior Publication Data

US 2015/0132613 A1 May 14, 2015

(30) Foreign Application Priority Data

Nov. 12, 2013 (JP) ................. 2013-234442

(51) Int. Cl.
*H01M 10/42* (2006.01)
*G01R 31/378* (2019.01)
*G01R 31/388* (2019.01)
*H01M 10/48* (2006.01)
(Continued)

(52) U.S. Cl.
CPC ...... *H01M 10/4257* (2013.01); *G01R 31/378* (2019.01); *G01R 31/388* (2019.01); *H01M 10/4221* (2013.01); *G01R 31/367* (2019.01); *H01M 10/425* (2013.01); *H01M 10/44* (2013.01); *H01M 10/48* (2013.01); *H01M 10/486* (2013.01); *H01M 2010/4278* (2013.01); *H01M 2220/30* (2013.01)

(58) Field of Classification Search
CPC ....................... H01M 10/4257; G01R 31/3637
See application file for complete search history.

(56) References Cited

U.S. PATENT DOCUMENTS 5,350,993 A 9/1994 Toya et al.
5,434,495 A * 7/1995 Toko ................ G01R 19/16528
320/135
6,181,103 B1 1/2001 Chen
(Continued)

FOREIGN PATENT DOCUMENTS

EP 1 786 057 A2 5/2007
EP 2 448 057 A1 5/2012
(Continued)

OTHER PUBLICATIONS

Matsushima, Residual Capacity Estimation of Stationary Lithium-Ion Secondary Battery Based on Its Discharge Voltage Characteristics, Electronics and Communications in Japan, Part 1, vol. 90, No. 3, 2007 Translated from Denshi Joho Tsushin Gakkai Ronbunshi, vol. J89-B, No. 4, Apr. 2006, pp. 618-624 (Year: 2004).*
(Continued)

*Primary Examiner* — Jeremiah R Smith
(74) *Attorney, Agent, or Firm* — McDermott Will & Emery LLP

(57) ABSTRACT

A battery pack includes a rechargeable battery, a battery information memory unit configured to store battery type information relating to a type of the rechargeable battery, and an information output unit configured to output the battery type information from the battery pack.

4 Claims, 2 Drawing Sheets

(51) Int. Cl.
*H01M 10/44* (2006.01)
*G01R 31/367* (2019.01)

(56) References Cited

U.S. PATENT DOCUMENTS

| | | |
|---|---|---|
| 6,218,806 B1 | 4/2001 | Brotto et al. |
| 2001/0010455 A1 | 8/2001 | Brotto et al. |
| 2002/0144160 A1 | 10/2002 | Odaohhara et al. |
| 2007/0013341 A1 | 1/2007 | Hitomi et al. |
| 2007/0035274 A1 | 2/2007 | Brotto et al. |
| 2007/0108946 A1 | 5/2007 | Yamauchi et al. |
| 2008/0290833 A1 | 11/2008 | Hayashi |
| 2008/0290835 A1 | 11/2008 | Hayashi |
| 2010/0188039 A1 | 7/2010 | Yamauchi et al. |
| 2012/0015221 A1 | 1/2012 | Murase et al. |
| 2012/0100405 A1 | 4/2012 | Noda et al. |
| 2013/0018610 A1 | 1/2013 | Yamauchi et al. |
| 2013/0244062 A1 | 9/2013 | Teramoto et al. |
| 2014/0021959 A1* | 1/2014 | Maluf ............... G01R 31/3637 324/430 |

FOREIGN PATENT DOCUMENTS

| | | |
|---|---|---|
| EP | 2 645 464 A1 | 10/2013 |
| JP | 2000-032678 A | 1/2000 |
| JP | 2001-283929 A | 10/2001 |
| JP | 2006-228490 A | 8/2006 |
| JP | 2007-026712 A | 2/2007 |
| JP | 2008-295172 A | 12/2008 |
| JP | 4678284 B2 | 4/2011 |
| JP | 2011-161533 A | 8/2011 |
| JP | 2013-050358 A | 3/2013 |

OTHER PUBLICATIONS

Extended European Search Report issued in European Application No. 14191788.0 dated Feb. 16, 2015.
European Office Action dated Mar. 7, 2017 issued in European Patent Application No. 14 191 788.0.
Japanese Office Action dated May 9, 2017 issued in Japanese Patent Application No. 2013-234442 (with English translation).
Xinlong Zhao, "The electric car battery performance testing methods research and development test bench" Chinese Master's Theses Full-text Database, Engineering Science and Technology II, pp. 24-25, Aug. 15, 2009 (With full English translation of pp. 24-25).
The Second Office Action issued in corresponding Chinese Patent Application No. 201410642582.3, dated Oct. 9, 2017 (with full English Translation).

* cited by examiner

| Battery Type \ Detection Voltage | 2.0v | 2.5v | 3.0v | 3.5v | 4.0v |
|---|---|---|---|---|---|
| Lithium Ion | 0% | 0% | 10% | 40% | 90% |
| Nickel Hydrogen | 0% | 5% | 15% | 35% | 98% |

| Battery Type \ Detection Voltage | 2.0v | 2.5v | 3.0v | 3.5v | 4.0v |
|---|---|---|---|---|---|
| Lithium Ion | 0% | 0% | 15% | 90% | 100% |
| Nickel Hydrogen | 0% | 0% | 0% | 90% | 100% |

BATTERY PACK AND ELECTRIC DEVICE INCLUDING BATTERY PACK

CROSS-REFERENCE TO RELATED APPLICATIONS

This application is based upon and claims the benefit of priority from prior Japanese Patent Application No. 2013-234442, filed on Nov. 12, 2013, the entire contents of which are incorporated herein by reference.

FIELD

The present invention relates to a battery pack that includes a rechargeable battery, and an electric device that includes the battery pack.

BACKGROUND

As an electric device that operates by power supplied from a rechargeable battery, there has been known an electric power tool that drives a bit or a tip tool by driving force of a motor. In general, the electric power tool is configured to calculate a residual capacity of the rechargeable battery voltage based on a battery voltage. In the electric power tool, voltage drop of the rechargeable battery occurs when current is being supplied to the motor (i.e., load). The change in the battery voltage affects calculation accuracy of the residual capacity. In order to accurately calculate a residual capacity, Japanese Patent No. 4678284 describes an electric power tool that detects a battery voltage of a rechargeable battery after stopping supply of power to the load. The electric power tool described in the above publication changes an elapsed time from a stop of supplying power to a detection of the battery voltage in accordance with the operating time of the load and the amount of the current which has been supplied to the load before the stop of supplying power. This detects the battery voltage of the rechargeable battery in a stable state and improves calculation accuracy of the residual capacity.

SUMMARY

In general, the electric power tool is marketed together with a battery pack. However, the battery pack may be replaced and a different type of battery pack may be attached to the electric power tool. For each type of a rechargeable battery installed in the battery pack, a generated battery voltage, a battery capacity characteristic (a discharge capacity dependency of the battery voltage and the like), and a charge and discharge cycle number dependency of the battery capacity characteristic and the like are different. The electric power tool described in Japanese Patent No. 4678284 calculates the residual capacity based on the detection of the battery voltage, without taking into account the type of the rechargeable battery (battery pack) that is used. Therefore, in the electric power tool of the above publication, calculation error of the residual capacity may become large.

A battery pack according to one aspect includes a rechargeable battery, a battery information memory unit configured to store battery type information relating to a type of the rechargeable battery, and an information output unit configured to output the battery type information from the battery pack.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE EMBODIMENTS

First, characteristics of a battery pack and an electric device according to this disclosure will now be described.

In a first example, a battery pack is provided. The battery pack includes a rechargeable battery, a battery information memory unit configured to store battery type information relating to a type of the rechargeable battery, and an information output unit configured to output the battery type information from the battery pack.

In a second example, preferably, the battery type information includes information relating to a rated capacity of the rechargeable battery.

In a third example, preferably, the battery type information includes information relating to a manufacturer of the rechargeable battery.

In a fourth example, preferably, the battery type information includes information relating to a material of the rechargeable battery.

In a fifth example, preferably, the battery pack further includes a charging control unit configured to measure the number of charge/discharge cycles of the rechargeable battery. The information output unit is configured to output the battery type information including the number of charge/discharge cycles from the battery pack.

In a sixth example, preferably, the battery type information includes information indicating the relationship between a battery voltage of the rechargeable battery and a residual capacity of the rechargeable battery.

In a seventh example, an electric device is provided. The electric device includes a battery pack according to any one of the first to fifth examples or any combination thereof. The electric device further includes a capacity information memory unit configured to store the relationship between a battery voltage of the rechargeable battery and a residual capacity of the rechargeable battery, a control unit configured to acquire the battery type information from the battery pack, and a residual capacity calculation unit configured to calculate the residual capacity of the rechargeable battery by using the battery type information and the voltage capacity information.

In an eighth example, an electric device is provided. The electric device includes a battery pack according to the sixth example, a control unit configured to acquire the battery type information from the battery pack, and a residual capacity calculation unit configured to calculate a residual capacity of the rechargeable battery by using the battery type information.

Figure 1:
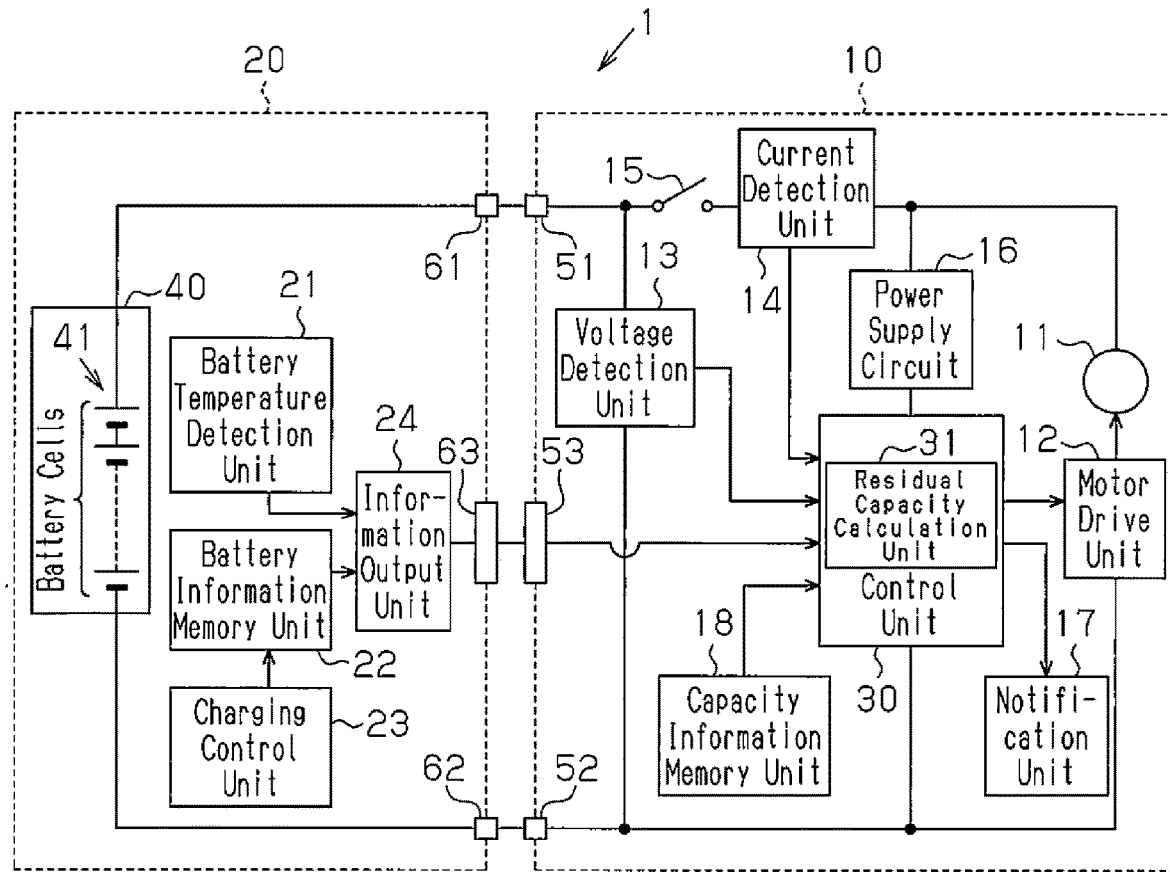
FIG. 1 is a block diagram of an electric power tool according to one embodiment.

The structure of an electric power tool 1 which serves as an electric device will now be described with reference to FIG. 1. The electric power tool 1 is, for example, a drill driver.

The electric power tool 1 includes an electric power tool body 10 and a battery pack 20. The electric power tool 1 has a structure capable of coupling and separating the electric power tool body 10 and the battery pack 20 to and from each other. The electric power tool 1 transmits a torque to a working subject component via a bit or a tip tool (not illustrated) coupled to the electric power tool body 10. An example of a working subject component is a screw or a bolt.

The electric power tool body 10 includes a motor 11, a motor drive unit 12, a voltage detection unit 13, a current detection unit 14, a power-on switch 15, a power supply circuit 16, a notification unit 17, a capacity information memory unit 18, and a control unit 30. The control unit 30 includes a residual capacity calculation unit 31.

The battery pack 20 includes a rechargeable battery 40, a battery temperature detection unit 21, a battery information memory unit 22, a charging control unit 23, and an information output unit 24. The rechargeable battery 40 consists of a plurality of battery cells 41 connected in series. An example of a battery cell is a lithium ion battery. Further, an example of the battery information memory unit 22 is a nonvolatile semiconductor memory device.

The electric power tool body 10 further includes a body-side positive voltage terminal 51, a body-side negative voltage terminal 52, and a body-side signal terminal 53. The battery pack 20 further includes a battery-side positive voltage terminal 61, a battery-side negative voltage terminal 62, and a battery-side signal terminal 63.

When the battery pack 20 is installed in the electric power tool body 10, the electric power tool body 10 and the battery pack 20 are coupled each other. Further, when the battery pack 20 is installed in the electric power tool body 10, the body-side positive voltage terminal 51, the body-side negative voltage terminal 52, and the body-side signal terminal 53 are brought into contact with and are electrically connected to the battery-side positive voltage terminal 61, the battery-side negative voltage terminal 62, and the battery-side signal terminal 63, respectively.

Functions of elements of the battery pack 20 will now be described.

The rechargeable battery 40 outputs a battery voltage, which is output from the battery cells 41, between the battery-side negative voltage terminal 62 and the battery-side positive voltage terminal 61. The battery temperature detection unit 21 detects an internal temperature of the battery pack 20 and generates a temperature detection signal corresponding to the value of the detected temperature.

The battery information memory unit 22 stores battery type information relating to the type of the rechargeable battery 40 which is installed in the battery pack 20. The battery type information is stored as information that affects a battery capacity characteristic of the rechargeable battery 40.

For example, the battery information memory unit 22 stores information relating to a material of the rechargeable battery 40 as the battery type information.

Figure 2:
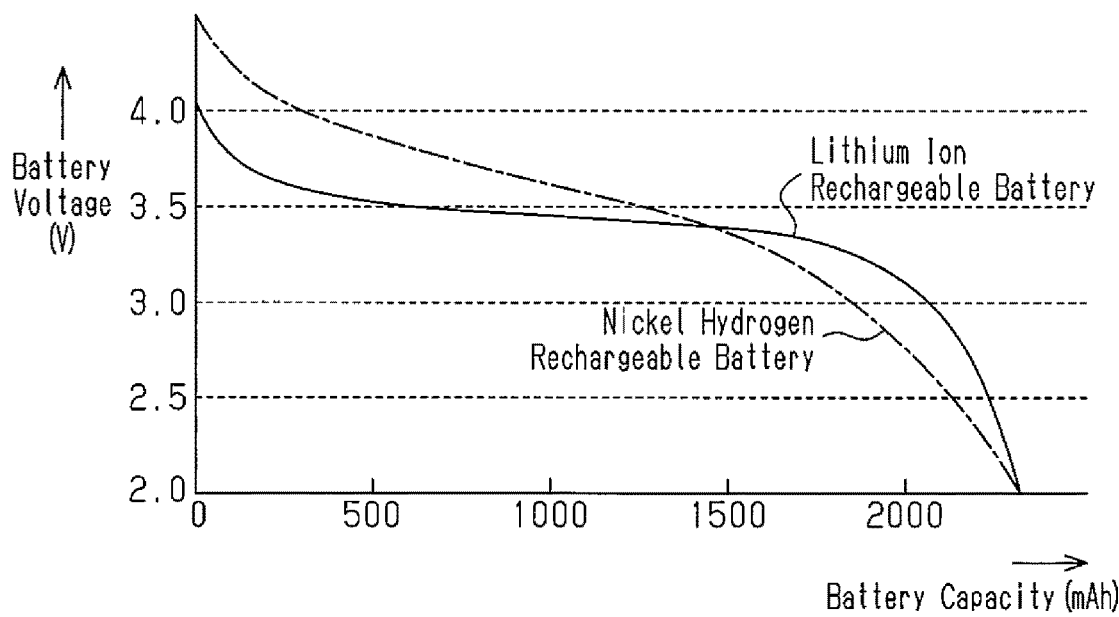
FIG. 2 is a graph illustrating an example of a battery capacity characteristic of a rechargeable battery.

As the rechargeable batteries 40 formed from different materials, there are a lithium ion rechargeable battery and a nickel hydrogen rechargeable battery, for example. Battery capacity characteristics of the lithium ion rechargeable battery and the nickel hydrogen rechargeable battery will now be described with reference to FIG. 2. A solid line in FIG. 2 illustrates an example of the battery capacity characteristic of the lithium ion rechargeable battery. A dashed-line in FIG. 2 illustrates an example of the battery capacity characteristic of the nickel hydrogen rechargeable battery.

As illustrated in FIG. 2, the battery voltage of the nickel hydrogen rechargeable battery at an initial using time is higher than the battery voltage of the lithium ion rechargeable battery at an initial using time. However, as the discharge capacity (battery capacity) increases, a voltage drop value of the nickel hydrogen rechargeable battery becomes large.

As described above, the rechargeable batteries 40 have different battery capacity characteristics according to the materials. Other examples of the rechargeable batteries are a lead storage battery, an alkaline rechargeable battery, a lithium ion polymer rechargeable battery, and the like. These rechargeable batteries also consist of mutually different materials and have mutually different battery capacity characteristics.

Further, the battery information memory unit 22 stores information relating to a rated capacity of the rechargeable battery 40 as the battery type information. The rated capacity of the rechargeable battery 40 is a total sum of an electricity amount that can be taken out from a discharge start to a discharge termination voltage. Thus, the battery capacity characteristic of the rechargeable battery 40 changes according to the rated capacity.

Further, the battery information memory unit 22 stores information relating to a manufacturer of the rechargeable battery 40 as the battery type information. Even when materials of the rechargeable batteries 40 are the same, battery capacity characteristics are different when manufacturing methods and manufacturing conditions are different.

The charging control unit 23 measures the number of charge/discharge cycles of the rechargeable battery 40. Battery capacity characteristics of the rechargeable battery 40 that change according to the number of charge/discharge cycles will now be described with reference to FIG. 3.

Figures 3, 4A, 4B:
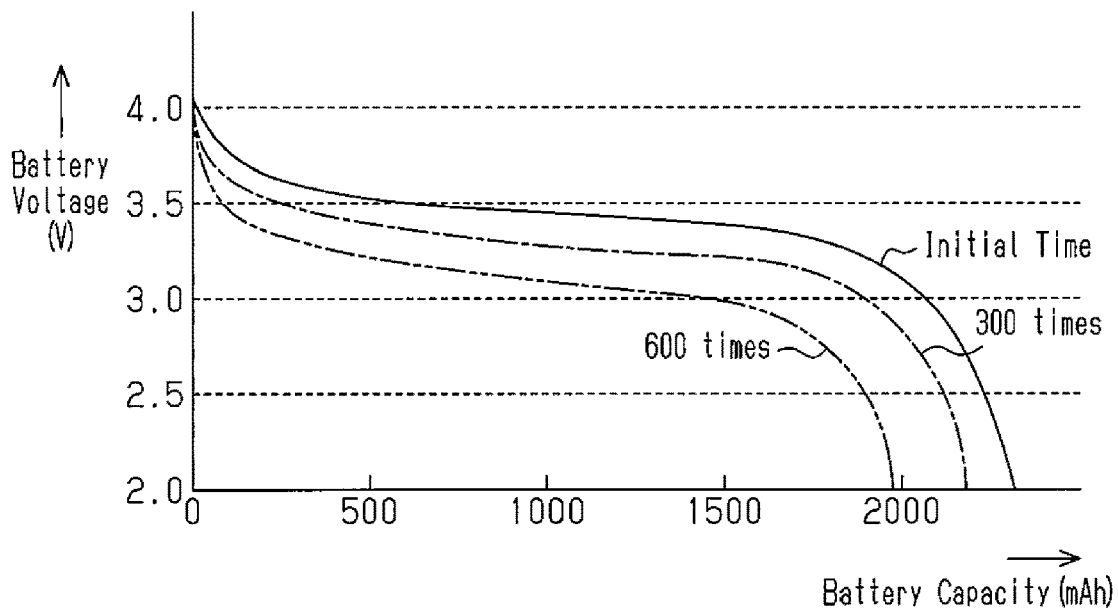
FIG. 3 is a graph illustrating an example of a charge/discharge cycle number dependency of the battery capacity characteristic of the rechargeable battery.
FIG. 4A is a table illustrating an example of the relationship between a battery voltage and a residual capacity of the rechargeable battery.
FIG. 4B is a table illustrating another example of the relationship between a battery voltage and a residual capacity of the rechargeable battery.

FIG. 3 illustrates an example of the case where the rechargeable battery 40 is a lithium ion rechargeable battery. A solid line in FIG. 3 illustrates an initial battery capacity characteristic. A dashed-line in FIG. 3 illustrates a battery capacity characteristic when the number of charge/discharge cycles is 300. A double-dashed line in FIG. 3 illustrates a battery capacity characteristic when the number of charge/discharge cycles is 600.

In the rechargeable battery 40, as the number of charge/discharge cycles increases, a discharge capacity dependency of a battery voltage drop amount increases. The charging control unit 23 stores the number of charge/discharge cycles in the battery information memory unit 22 as information that affects the battery capacity characteristic of the rechargeable battery 40. The charging control unit 23 updates the value of the number of charge/discharge cycles stored in the battery information memory unit 22, each time charging and discharging of the rechargeable battery 40 is performed.

The information output unit 24 reads the information stored in the battery information memory unit 22 and outputs the read information to the battery-side signal terminal 63. Further, the information output unit 24 outputs the temperature detection signal of the battery temperature detection unit 21 to the battery-side signal terminal 63.

Functions of elements of the electric power tool body 10 will now be described.

The power-on switch 15 conducts and blocks an electric path from the body-side positive voltage terminal 51 to the current detection unit 14. The power-on switch 15 is opened and closed based on the operation of the user of the electric power tool 1. When the power-on switch 15 is in the on-state, the electric path from the body-side positive voltage terminal 51 to the current detection unit 14 is electrically connected, and power is supplied from the body-side positive voltage terminal 51 to the power supply circuit 16 and the motor 11 through the current detection unit 14.

When the power-on switch 15 is in the off-state, the electric path from the body-side positive voltage terminal 51 to the current detection unit 14 is blocked, and supply of power to the power supply circuit 16 and the motor 11 is stopped. Thus, the electric power tool 1 stops the operation.

The voltage detection unit 13 detects a voltage between the body-side negative voltage terminal 52 and the body-side positive voltage terminal 51 that is applied from the rechargeable battery 40 via the battery-side negative voltage terminal 62 and the battery-side positive voltage terminal 61. The voltage detection unit 13 detects the battery voltage of the rechargeable battery 40 when the battery pack 20 is installed in the electric power tool body 10.

When the power-on switch 15 is in the on-state, the power supply circuit 16 stabilizes the voltage of the rechargeable battery 40 supplied via the battery-side positive voltage terminal 61 and the body-side positive voltage terminal 51 and supplies the stabilized voltage to the control unit 30.

The capacity information memory unit 18 stores voltage capacity information as information that indicates the relationship between the battery voltage and the residual capacity of the rechargeable battery 40. The capacity information memory unit 18 stores voltage capacity information relating to a plurality of types of the rechargeable batteries 40 (battery packs 20) that can be installed in the electric power tool body 10.

The voltage capacity information will now be described with reference to FIGS. 4A and 4B. FIGS. 4A and 4B illustrate examples of the case where the rechargeable batteries 40 are a lithium ion rechargeable battery and a nickel hydrogen battery. FIG. 4A illustrates an example of voltage capacity information at an initial using time when the number of charge/discharge cycles is extremely small. FIG. 4B illustrates an example of voltage capacity information when the number of charge/discharge cycles is larger than 600.

As illustrated in FIGS. 4A and 4B, the capacity information memory unit 18 stores as the voltage capacity information the residual capacity value of the battery voltage (detection voltage) according to the number of charge/discharge cycles for each type of the rechargeable battery 40.

The control unit 30 operates by power supplied from the power supply circuit 16. The control unit 30 obtains the information, which is output from the information output unit 24, via the body-side signal terminal 53 and the battery-side signal terminal 63. Further, the control unit 30 supplies a control signal to the motor drive unit 12 and the notification unit 17.

The residual capacity calculation unit 31 calculates the residual capacity of the rechargeable battery 40 based on the information obtained by the control unit 30.

The current detection unit 14 detects a current that flows from the body-side positive voltage terminal 51 to the power supply circuit 16 and the motor 11 through the power-on switch 15, and generates a current detection signal according to the detected current. The current detection signal is supplied to the control unit 30.

The motor drive unit 12 drives the motor 11 based on the control signal supplied from the control unit 30. The motor drive unit 12 controls a start and a stop of the driving of the motor 11. Further, the motor drive unit 12 controls the number of rotations of the output shaft of the motor 11.

The notification unit 17 is connected to the control unit 30, and performs various notifications to the user based on a notification control signal which is supplied from the control unit 30. For example, the notification unit 17 performs a notification of the residual capacity value of the rechargeable battery 40, a notification that the residual capacity of the rechargeable battery 40 has become equal to or lower than a predetermined threshold capacity, and a notification of an arrival of a charging time. The notification unit 17 includes, for example, a liquid crystal display and displays the residual capacity by a numerical value in a percentage unit.

Next, the operation of the electric power tool 1 will now be described.

When the battery pack 20 has been installed in the electric power tool body 10, power is supplied from the rechargeable battery 40 to the electric power tool body 10 via the battery-side negative voltage terminal 62, the battery-side positive voltage terminal 61, the body-side negative voltage terminal 52, and the body-side positive voltage terminal 51. When the power-on switch 15 has been turned on, the electric power tool body 10 starts operation.

When the power-on switch 15 has been turned on, the control unit 30 starts operation by the power supplied from the power supply circuit 16. The motor drive unit 12 drives the motor 11 based on the control signal from the control unit 30.

At a using time of the electric power tool 1, the electric power tool body 10 repeatedly executes operation of confirming the residual capacity of the rechargeable battery 40.

For example, the residual capacity calculation unit 31 calculates the residual capacity of the rechargeable battery 40 based on the following operation executed by the control unit 30.

The control unit 30 obtains the battery type information read from the battery information memory unit 22 by the information output unit 24. The control unit 30 reads the voltage capacity information from the capacity information memory unit 18, based on the battery type information. That is, the control unit 30 obtains the voltage capacity information corresponding to the type of the rechargeable battery 40 according to the battery type information. The voltage capacity information is used to calculate the residual capacity.

Next, the control unit 30 acquires the battery voltage of the rechargeable battery 40 detected by the voltage detection unit 13. The residual capacity calculation unit 31 calculates the residual capacity based on the battery voltage and the voltage capacity information of the rechargeable battery 40.

The procedure of calculating the residual capacity may not be in the described order as long as the residual capacity calculation unit 31 can calculate the residual capacity based on the battery voltage and the voltage capacity information of the rechargeable battery 40 obtained by the control unit 30.

After the residual capacity has been calculated, the control unit 30 outputs the information of the residual capacity to the notification unit 17. When the residual capacity calculated by the residual capacity calculation unit 31 has become equal to or lower than the predetermined threshold capacity, the control unit 30 outputs an alarm generation signal to the notification unit 17 as a notification control signal.

The notification unit 17 displays the residual capacity by a numerical value in a percentage unit, based on the information of the residual capacity. Further, in response to the alarm generation signal, the notification unit 17 notifies the user that the residual capacity has become equal to or lower than the threshold capacity and notifies the user of the arrival of the charging time. For example, the notification unit 17 makes the display element such as an LED blink.

Next, the operation of the electric power tool 1 according to the present embodiment will now be described.

The battery type information of the rechargeable battery 40 of the battery pack 20 is stored in the battery information memory unit 22. On the other hand, the voltage capacity information of the plurality of types of the rechargeable batteries is stored in the capacity information memory unit 18 of the electric power tool body 10. The residual capacity calculation unit 31 calculates the residual capacity based on the battery voltage of the rechargeable battery 40 and the voltage capacity information corresponding to the battery type information of the rechargeable battery 40.

According to this structure, even when the battery pack 20 including a different type of the rechargeable battery 40 is installed in the electric power tool body 10, the residual capacity may be accurately calculated by using the voltage capacity information according to the types of the rechargeable battery 40.

The electric power tool 1 according to the present embodiment has the following advantages.

(1) The battery pack 20 stores information relating to the types of the rechargeable batteries 40 as the battery type information. The electric power tool body 10 obtains the information relating to the type of the rechargeable battery 40 from the battery pack 20 installed in the electric power tool body 10, and calculates the residual capacity of the rechargeable battery 40 by using this information. Accordingly, calculation accuracy of the residual capacity of the rechargeable battery 40 may be improved.

(2) The battery type information includes information relating to the rated capacity of the rechargeable battery 40. Accordingly, calculation accuracy of the residual capacity of the rechargeable battery 40 may be improved by using the information relating to the rated capacity according to the type of the rechargeable battery 40.

(3) The battery type information includes information relating to the manufacturer of the rechargeable battery 40. Accordingly, calculation accuracy of the residual capacity of the rechargeable battery 40 may be improved by using the information relating to the manufacturer according to the type of the rechargeable battery 40.

(4) The battery type information includes information relating to the material of the rechargeable battery 40. Accordingly, calculation accuracy of the residual capacity of the rechargeable battery 40 may be improved by using the information relating to the material according to the type of the rechargeable battery 40.

(5) The battery pack 20 stores not only the battery type information but also the number of charge/discharge cycles of the rechargeable battery 40, as information that affects the battery capacity characteristic. Thus, the electric power tool body 10 may calculate the residual capacity by taking into account the charge/discharge cycle number dependency of the battery voltage of the rechargeable battery 40. Accordingly, even when the number of charge/discharge cycles of the rechargeable battery 40 that is continuously used has increased, the electric power tool body 10 may accurately calculate the residual capacity.

(6) The electric power tool body 10 stores the voltage capacity information of a plurality of types of the rechargeable batteries 40. Thus, the electric power tool body 10 may calculate the residual capacity of the rechargeable battery 40 by using the voltage capacity information according to the type of the rechargeable battery 40 (battery pack 20) that is installed in the electric power tool body 10. Accordingly, even when a different type of the rechargeable battery 40 is installed in the electric power tool body 10, the electric power tool body 10 may accurately calculate the residual capacity of the rechargeable battery 40.

It should be apparent to those skilled in the art that the present invention may be embodied in many other specific forms without departing from the spirit or scope of the invention. Particularly, it should be understood that the present invention may be embodied in the following forms.

(A) The battery pack 20 may have a battery ID information memory unit in place of the battery information memory unit 22. The battery ID information memory unit stores individual specific information of the battery pack 20. The individual specific information includes information relating to a manufacturing number and a product number of the battery pack 20. The capacity information memory unit 18 of the electric power tool body 10 stores the battery type information relating to the type of a rechargeable battery that can be installed in the electric power tool body 10, in addition to the voltage capacity information. When calculating the residual capacity of the rechargeable battery 40, the electric power tool body 10 (control unit 31) specifies the battery type information of the rechargeable battery 40 corresponding to the individual specific information of the battery pack 20, and acquires voltage capacity information corresponding to the battery type information (that is, individual specific information) from the capacity information memory unit 18. Then, the residual capacity calculation unit 31 calculates the residual capacity based on the battery voltage and the voltage capacity information of the rechargeable battery 40.

According to this structure, calculation accuracy of the residual capacity of the rechargeable battery 40 may be improved in a simple structure of the battery pack 20.

(B) The battery information memory unit 22 may store voltage capacity information of the rechargeable battery 40 (information indicating the relationship between a battery voltage and a battery capacity of the rechargeable battery 40), in addition to the battery type information of the rechargeable battery 40. In this case, the residual capacity calculation unit 31 calculates the residual capacity by acquiring the battery type information and the voltage capacity information of the rechargeable battery 40 from the battery information memory unit 22.

According to this structure, calculation accuracy of the residual capacity of the rechargeable battery 40 may be improved in a simple structure of the electric power tool body 10.

(C) The residual capacity calculation unit 31 may correct the residual capacity value based on the internal temperature of the battery pack 20 detected by the battery temperature detection unit 21.

According to this structure, calculation accuracy of the residual capacity may be more improved.

(D) The electric power tool 1 is not limited to a drill driver. For example, the electric power tool 1 may be an impact driver, an impact wrench, a hammer drill, a vibrating drill, a jigsaw, a sealing gun, or a round saw.

(E) The electric device is not limited to the electric power tool 1. For example, the electric device may be a laptop computer or a digital camera. That is, the electric device may be an arbitrary portable electronic information terminal using a rechargeable battery.

(F) The battery pack 20 may include a microcontroller. In this case, the microcontroller of the battery pack 20 may function as the charging control unit 23 and the information output unit 24.

(G) The electric power tool body 10 may include a microcontroller. In this case, the microcontroller of the electric power tool body 10 may function as the control unit 30 and the residual capacity calculation unit 31.

(H) The capacity information memory unit 18 may store a formula for calculating the battery capacity based on the battery voltage, in place of storing the voltage capacity information (information that indicates the relationship between a battery voltage and a battery capacity of the rechargeable battery 40).

(I) The electric power tool body 10 may have a residual capacity confirmation switch. In this case, when the user operates the residual capacity confirmation switch, the residual capacity calculation unit 31 calculates the residual capacity of the rechargeable battery 40.

(J) The notification unit 17 is not limited to display the residual capacity by a numerical value in a percentage unit. For example, the notification unit 17 may display a level meter constituted by a plurality of display segments. In this case, the notification unit 17 notifies the residual capacity value by changing the number of lights of the display segment.

(K) The notification unit 17 may include a voice generation device such as a buzzer and transmit a notification from the voice generation device.

(L) The residual capacity calculation unit 31 may be provided separately from the control unit 30. That is, the residual capacity calculation unit 31 may be realized as a function of the control unit 30 by a residual capacity calculation program (software) that is executed by the control unit 30, or may be realized by a hardware such as an integrated circuit.

The invention claimed is:

1. An electric device comprising:
an electric device body; and
a battery pack,
wherein the battery pack comprises:
   a rechargeable battery;
   a battery information memory unit configured to store battery type information relating to a type of the rechargeable battery, wherein the battery type information includes information relating to a material of the rechargeable battery;
   a charging control unit configured to measure the number of charge/discharge cycles of the rechargeable battery and to store the number of charge/discharge cycles in the battery information memory unit; and
   an information output unit configured to output the battery type information from the battery pack, wherein the information output unit is configured to output the battery type information including the number of charge/discharge cycles from the battery pack, and wherein the electric device body comprises:
   a control unit configured to obtain the battery type information which is output from the information output unit; and
   a residual capacity calculation unit configured to calculate a residual capacity of the rechargeable battery based on voltage capacity information,
the voltage capacity information includes a value of the residual capacity associated with
   i) a battery voltage of the rechargeable battery,
   ii) the type of the rechargeable battery according to the battery type information, and
   iii) the number of charge/discharge cycles for the rechargeable battery,
the voltage capacity information is stored in the battery information memory unit of the battery pack or in a capacity information memory unit of the electric device body,
the voltage capacity information is stored in stages for different numbers of charge/discharge cycles and includes, for each stage of the number of charge/discharge cycles, the value of the residual capacity corresponding to both of the battery voltage and the type of the rechargeable battery, and
the electric device body further comprises a notification unit including a level meter constituted by a plurality of display segments, wherein the notification unit notifies the value of the residual capacity by changing the number of lights of the display segment.

2. The electric device according to claim 1, wherein the battery type information includes information relating to a rated capacity of the rechargeable battery.

3. The electric device according to claim 1, wherein the battery type information includes information relating to a manufacturer of the rechargeable battery.

4. The electric device according to claim 1, wherein the battery type information includes the voltage capacity information.

* * * * *